US008269708B2

(12) United States Patent
Tahata

(10) Patent No.: US 8,269,708 B2
(45) Date of Patent: Sep. 18, 2012

(54) DRIVER UNIT INCLUDING COMMON LEVEL SHIFTER CIRCUIT FOR DISPLAY PANEL AND NONVOLATILE MEMORY

(75) Inventor: Takashi Tahata, Kanagawa (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 1329 days.

(21) Appl. No.: 11/475,070

(22) Filed: Jun. 27, 2006

(65) Prior Publication Data

US 2007/0001981 A1 Jan. 4, 2007

(30) Foreign Application Priority Data

Jun. 29, 2005 (JP) ................................ 2005-190230

(51) Int. Cl.

*G09G 3/36* (2006.01)
*G09G 5/00* (2006.01)
*G06T 1/60* (2006.01)
*G06F 3/038* (2006.01)
*G11C 7/00* (2006.01)
*H03K 19/094* (2006.01)
*H03K 19/082* (2006.01)

(52) U.S. Cl. ..... 345/98; 345/530; 345/211; 365/189.11; 326/88; 326/92

(58) Field of Classification Search .................. 345/530, 345/211, 98; 365/189.11; 326/88, 92
See application file for complete search history.

(56) References Cited

U.S. PATENT DOCUMENTS 5,576,737 A * 11/1996 Isozaki ......................... 345/211
6,222,518 B1 * 4/2001 Ikeda et al. ..................... 345/98
6,300,797 B1 * 10/2001 Koizumi ......................... 326/82
6,980,045 B1 * 12/2005 Liu .............................. 327/536

FOREIGN PATENT DOCUMENTS

JP 10-050085 A 2/1998
JP 2001085985 A * 3/2001

* cited by examiner

*Primary Examiner* — Sumati Lefkowitz
*Assistant Examiner* — Jonathan Horner
(74) *Attorney, Agent, or Firm* — Sughrue Mion, PLLC

(57) ABSTRACT

In a driver unit for driving a display panel and a nonvolatile memory, a level shifter circuit receives a driver control signal to generate a level-shifted driver control signal. A display panel driver circuit drives the display panel in accordance with the level-shifted driver control signal. A nonvolatile memory driver circuit drives the nonvolatile memory in accordance with the level-shifted driver control circuit. A selection circuit selects one of the display panel driver circuit and the nonvolatile memory driver circuit.

16 Claims, 8 Drawing Sheets

DRIVER UNIT INCLUDING COMMON LEVEL SHIFTER CIRCUIT FOR DISPLAY PANEL AND NONVOLATILE MEMORY

BACKGROUND OF THE INVENTION

1. Field of the Invention

The present invention relates to a display apparatus including a display panel and a nonvolatile memory so-called a flash memory, and more particularly, to a driver unit used therein.

2. Description of the Related Art

Recently, as high-level video and information technology as well as multi-media systems have been developed, display apparatuses have become more important. Particularly, flat panel type display apparatuses such as liquid crystal display (LCD) apparatuses, plasma display apparatuses and organic electroluminescence (EL) display apparatuses are lower in power consumption, lighter in weight and thinner in size, and therefore, have been applied to mobile telephone apparatuses or personal digital assistants (PDAs).

Conventionally, display apparatuses including display panels also include mask-type read-only memories (ROMs) for storing initial display data, etc. However, mask-type ROMs have a disadvantage in that their content is determined when they are manufactured, so that the content cannot be changed.

In order to overcome the above-mentioned disadvantage of mask-type ROMs, the mask-type ROMs have been replaced by nonvolatile memories, i.e., so-called flash memories.

A prior art display apparatus including a display panel and a nonvolatile memory is constructed by two individual step-up circuits each for one of the display panel and the nonvolatile memory, since the step-up circuit for the display panel is required to have a small current driving capability and a relatively high output voltage such as 40V to decrease the power consumption, while the step-up circuit for the nonvolatile memory is required to have a large current driving capability and a relatively low output voltage such as 10V. This will be explained later in detail.

SUMMARY OF THE INVENTION

In the above-described prior art display apparatus, however, since a level shifter circuit for the display panel and a level shifter circuit for the nonvolatile memory are individually provided, the display apparatus becomes large in size.

Additionally, since two individual step-up circuits are required, the display apparatus also becomes large in size.

According to the present invention, one level shift circuit is provided commonly for the display panel and the nonvolatile memory. As a result, the display apparatus, particularly, the driver unit thereof becomes small in size.

Additionally, one step-up circuit is provided commonly for the display panel and the nonvolatile memory. As a result, the display apparatus, particularly, the driver unit thereof becomes small in size.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art display apparatuses will be explained with reference to FIGS. 1 and 2.

Figure 1:
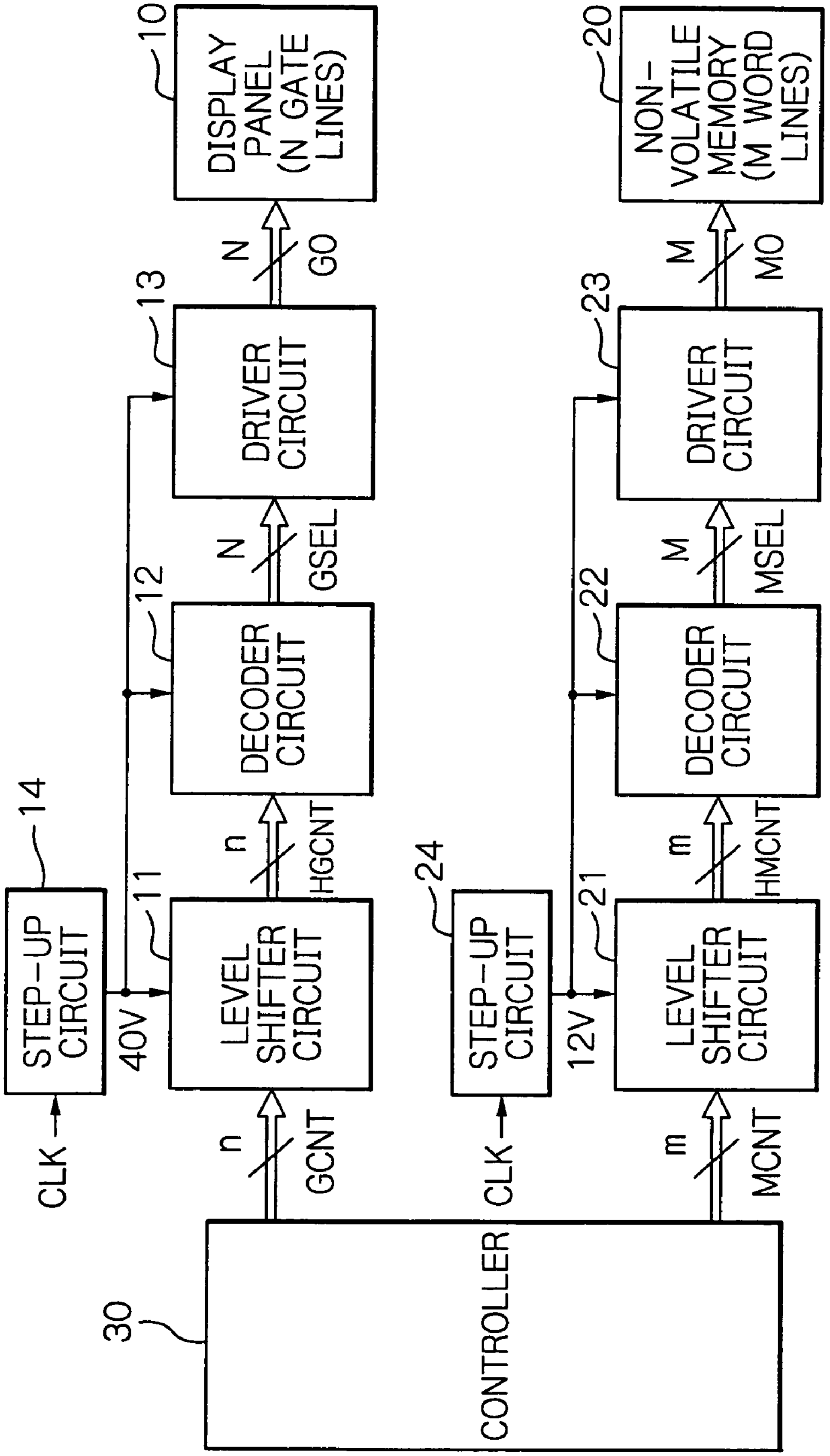
Fig. 1 PRIOR ART
FIG. 1 is a block circuit diagram illustrating a prior art display apparatus.

In FIG. 1, which illustrates a prior art display apparatus, a display panel 10 is generally constructed by dots located at intersections between a plurality of data lines (or signal lines) and a plurality of gate lines (or scan lines). In this case, assume that the number of the gate lines is N. The gate lines of the display panel 10 are driven by a level shifter circuit 11, a decoder circuit 12 and a driver circuit 13 which are powered by a remarkably high voltage such as 40V generated by a step-up circuit 14. Note that the decoder circuit 12 and the driver circuit 13 broadly define a gate line driver. On the other hand, the data lines of the display panel 10 are driven by a data line driver (not shown).

Also, a nonvolatile memory 20 is generally constructed by cells located at intersections between a plurality of word lines and a plurality of bit lines. In this case, assume that the number of the word lines is M. The word lines are driven by a level shifter circuit 21, a decoder circuit 22 and a driver circuit 23 which are powered by a relatively high voltage such as 12V generated by a step-up circuit 24. Note that the decoder circuit 22 and the driver circuit 23 broadly define a nonvolatile memory row driver. Also, the bit lines as well as data lines of the nonvolatile memory 20 are driven by another nonvolatile column memory driver (not shown).

A controller 30 is provided to control the level shifter circuits 11 and 21 as well as the data line driver (not shown) for the display panel 10 and the nonvolatile memory column decoder (not shown).

In more detail, the controller 30 generates an n-bit gate driver control signal GCNT and transmits it to the level shifter circuit 11. As a result, the level shifter circuit 11 shifts the n-bit gate driver control signal GCNT in accordance with the stepped voltage such 40V to generate an n-bit level-shifted gate driver control signal HGCNT which is transmitted to the decoder circuit 12. The decoder circuit 12 decodes the level-shifted gate driver control signal HGCNT to generate an N-bit gate selection signal GSEL which is buffered by a driver circuit 13. In this case, $N=2^n$, for example. The driver circuit 13 generates an N-bit gate driving signal G0 in accordance with the N-bit gate selection signal GSEL, so that one of the gate lines of the display panel 10 is driven.

Also, the controller 30 generates an m-bit nonvolatile memory row control signal MCNT and transmits it to the level shifter circuit 21. As a result, the level shifter circuit 21 shifts the m-bit nonvolatile memory row control signal MCNT in accordance with the stepped voltage such 12V to generate an m-bit level-shifted nonvolatile memory row control signal HMCNT which is transmitted to the decoder circuit 22. The decoder circuit 22 decodes the level-shifted nonvolatile memory row control signal HMCNT to generate an M-bit nonvolatile memory row selection signal MSEL which is buffered by a driver circuit 23. In this case, $M=2^m$, for example. The driver circuit 23 generates an M-bit nonvolatile memory row driving signal M0 in accordance with the M-bit nonvolatile memory row selection signal MSEL, so that one row of the nonvolatile memory cells of the nonvolatile memory 20 is driven.

In FIG. 1, since the current driving capability of the step-up circuit 14 is caused to be so small as to decrease the power consumption of the entire display apparatus of FIG. 1, the current driving capability of the step-up circuit 24 is larger than that of the step-up circuit 14.

Figure 2:
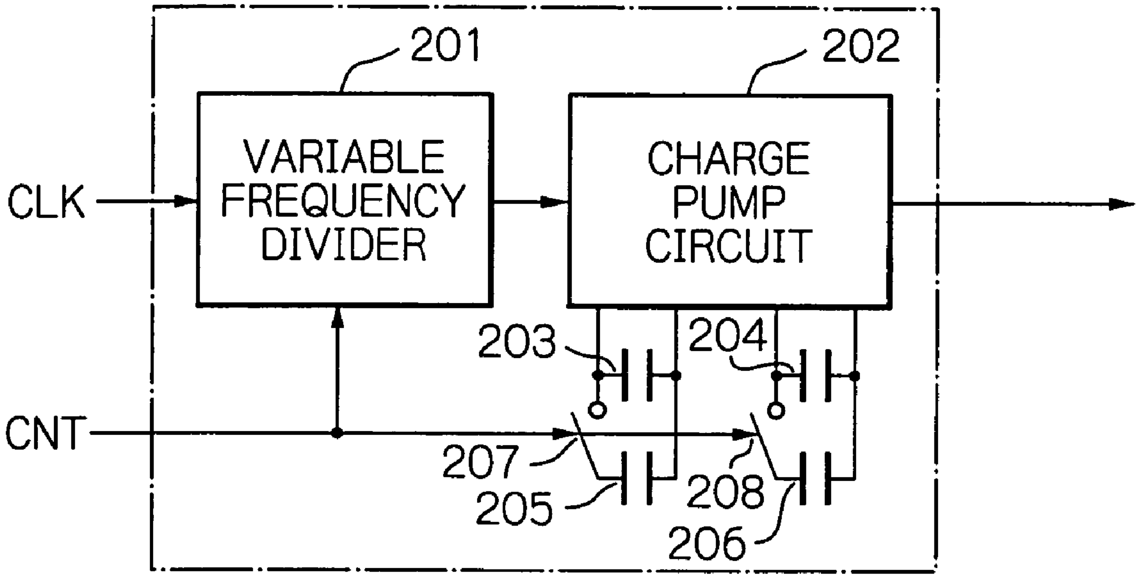
Fig. 2 PRIOR ART
FIG. 2 is a detailed block circuit diagram of the step-up circuit.

In FIG. 2, which illustrates a prior art step-up circuit (see: FIG. 2 of JP-10-50085-A), a step-up circuit is constructed by a variable frequency divider 201, a charge pump circuit 202, a step-up capacitor 203, a smoothing capacitor 204, an auxiliary step-up capacitor 205, an auxiliary smoothing capacitor 206, and switching transistor elements 207 and 208. That is, when a control signal CNT is "0" (low level), the frequency of the variable frequency divider 201 is made low and the switching transistor elements 207 and 208 are turned OFF to substantially increase the capacitance of the step-up capacitor 203 as well as that of the smoothing capacitor 204. As a result, the current driving capability of the step-up circuit is decreased to 40V. On the other hand, when the control signal CNT is "1" (high level), the frequency of the variable frequency divider 201 is made high and the switching transistor elements 207 and 208 are turned ON to substantially decrease the capacitance of the step-up capacitor 203 as well as that of the smoothing capacitor 204. As a result, the current driving capability of the step-up circuit is increased. Thus, the higher the output signal of the variable frequency divider, the larger the current driving capability.

On the other hand, generally, the larger the number of charge pump circuits connected in series in a step-up circuit, the larger the output voltage of the step-up circuit.

Thus, the step-up circuit 14 can have a small current driving capability and a high output voltage, while the step-up circuit 24 can have a large current driving capability and a low output voltage.

In the display apparatus of FIG. 1, however, since the bit number "n" of the level shifter circuit 11 is generally different from the bit number "m" of the level shifter circuit 21, so that the level shifter circuits 11 and 21 need to be individually provided, the display apparatus becomes large in size. Additionally, since the output voltage of the step-up circuit 14 is different from that of the step-up circuit 24, so that the step-up circuits 14 and 24 are individually provided, the display apparatus also becomes large in size.

Figure 3:
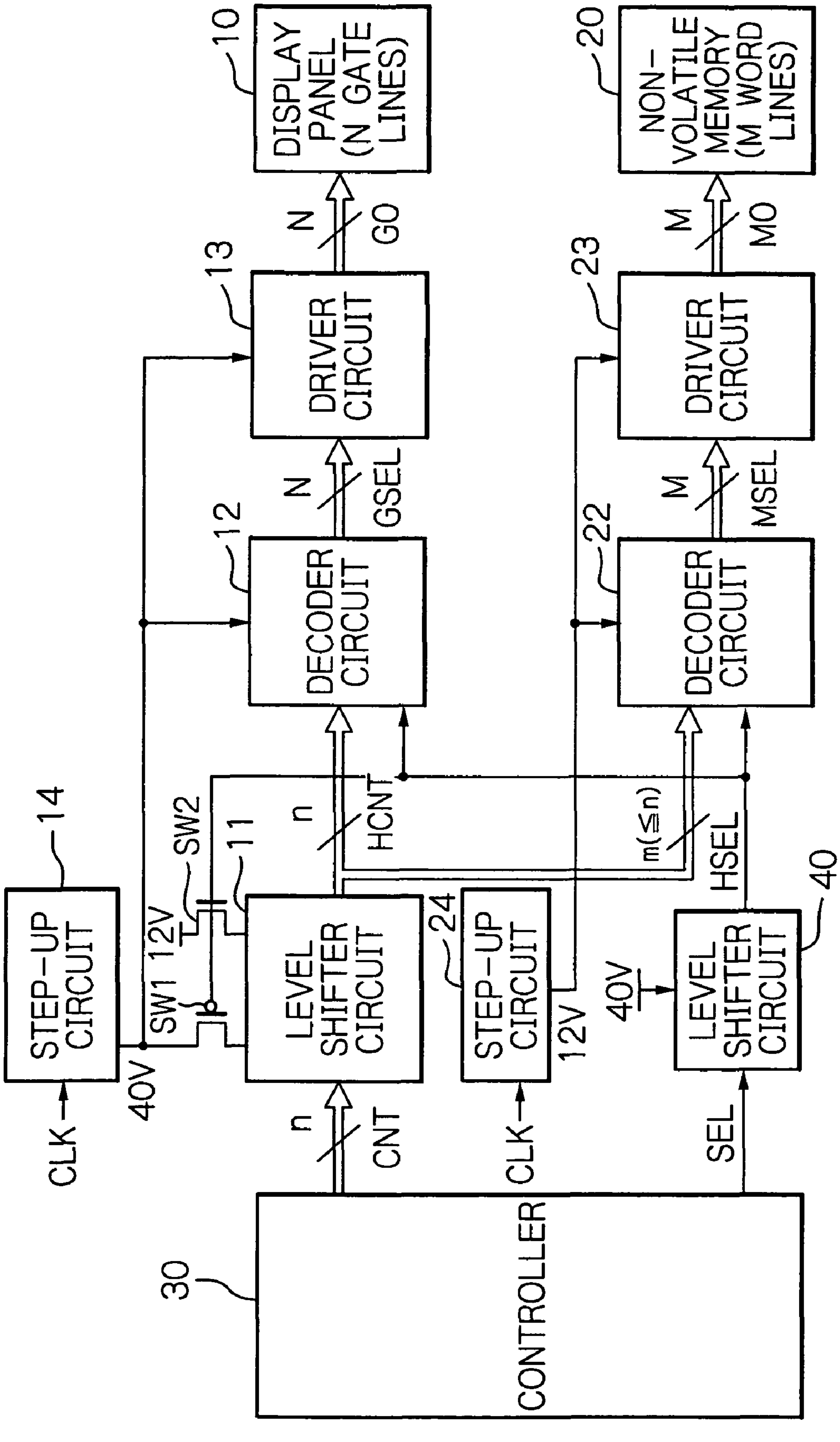
FIG. 3 is a block circuit diagram illustrating a first embodiment of the display apparatus according to the present invention.

In FIG. 3, which illustrates a first embodiment of the display apparatus according to the present invention, the level shifter circuit 11 of FIG. 1 is provided commonly for the display panel 10 and the nonvolatile memory 20. In this case, the level shifter circuit 11 receives an n-bit driver control signal CNT to generate an n-bit level-shifted driver control signal GCNT in accordance with 40V or 12V. Therefore, the level shifter circuit 21 of FIG. 1 is not provided. Instead of this, a level shifter circuit 40 serving as a selector is provided, and a p-MOS type switch SW1 and an n-MOS type switch SW2 controlled by the level shifter circuit 40 are connected to the level shifter circuit 11. Note that the p-MOS type switch SW1 and the n-MOS type switch SW2 can be replaced by other analog switches. Additionally, the decoder circuits 12 and 22 have an activating/deactivating terminal controlled by the level shifter circuit 40, so that the decoder circuits 12 and 22 can be exclusively operated. That is, one of the decoder circuits 12 and 22 is activated while the other is deactivated.

The level shifter circuit 40 powered by 40V receives a selection signal SEL from the controller 30 to generate a level-shifted selection signal HSEL. As a result, when HSEL="0" (low level), the level shifter circuit 11 is powered by 40V through the switch SW1 while the decoder circuits 12 and 22 are activated and deactivated, respectively, so that the display panel 10 is operated and the nonvolatile memory 20 is in a standby state. On the other hand, when HSEL="1" (high level), the level shifter circuit 11 is powered by 12V through the switch SW2 while the decoder circuits 12 and 22 are deactivated and activated, respectively, so that the display panel 10 is in a standby state and the nonvolatile memory 20 is operated.

An example of the display panel 10 is an LCD panel. The LCD panel has pixels each formed by three color dots, R (red), G (green) and B (blue) located at intersections between data lines and scan lines. One dot is formed by one thin film transistor (TFT) and one liquid crystal cell sandwiched by an array substrate and a counter substrate. Also, one pixel electrode is arranged at each intersection between the data lines and the gate lines. A gate of the TFT is connected to one of the gate lines, a source (or drain) of the TFT is connected to one of the data lines, and a drain (or source) of the TFT is connected to one of the pixel electrodes.

On the other hand, a common electrode and color filters R (red), G (green) and B (blue) are formed on the counter substrate. Note that the common electrode is a transparent electrode having a face opposing the pixel electrodes and another face to which a polarization plate is adhered. Also, a backlight unit is provided to irradiate the LCD panel with light.

Note that the data line driver (not shown) is controlled by the controller 30 to apply gradation voltages to the data lines of the LCD panel. The breakdown voltage of the data line driver which is 6V, for example.

The circuits 11 to 14 and 20 to 24 and the controller 30 are formed as a driver apparatus separately from the LCD panel; however, if system-on-glass (SOG) technology is used, these circuits 11 to 14 and 20 to 24 and the controller 30 can be formed on the LCD panel.

When one of the gate lines is selected by the driver circuit 13, all the TFTs connected to the selected gate line are turned ON. As a result, gradation voltages corresponding to display data are supplied by the data line driver to the corresponding pixel electrodes through the turned-ON TFTs, so that charges are stored in the corresponding pixel electrodes. The liquid between each of the pixel electrodes and the common electrode is arranged in accordance with the difference in potential therebetween, to control the deflection direction of light penetrated through the polarization plate, thus controlling the transmission of light. Each pixel of the LCD panel displays the colors R, G and B whose gray values corresponding to the light transmitted therethrough.

The controller 30 receives display data signals such as color signals R, G and B and various control signals such as a horizontal synchronization signal and a vertical synchronization signal from an external apparatus such as a personal computer to generate video signals (not shown), the data driver control signal (not shown), the gate driver control signal GCNT and the selection signal SEL. Also, the controller 30 receives write data and erase data from the external apparatus.

When the nonvolatile memory 20 is operated by the level-shifted selection signal HSEL, the set-up sequence of a supply voltage to the nonvolatile memory 20, a voltage VCOM at the common electrode of the display panel 10 or the like is written into the nonvolatile memory 20, or data is read from the nonvolatile memory 20 to the controller 30. Note that, as explained above, the display panel 10 and the nonvolatile memory 20 are exclusively operated by the level-shifted selection signal HSEL. For example, when the display panel 10 carries out a display operation, no write/erase operation is performed upon the nonvolatile memory 20.

Figure 4:
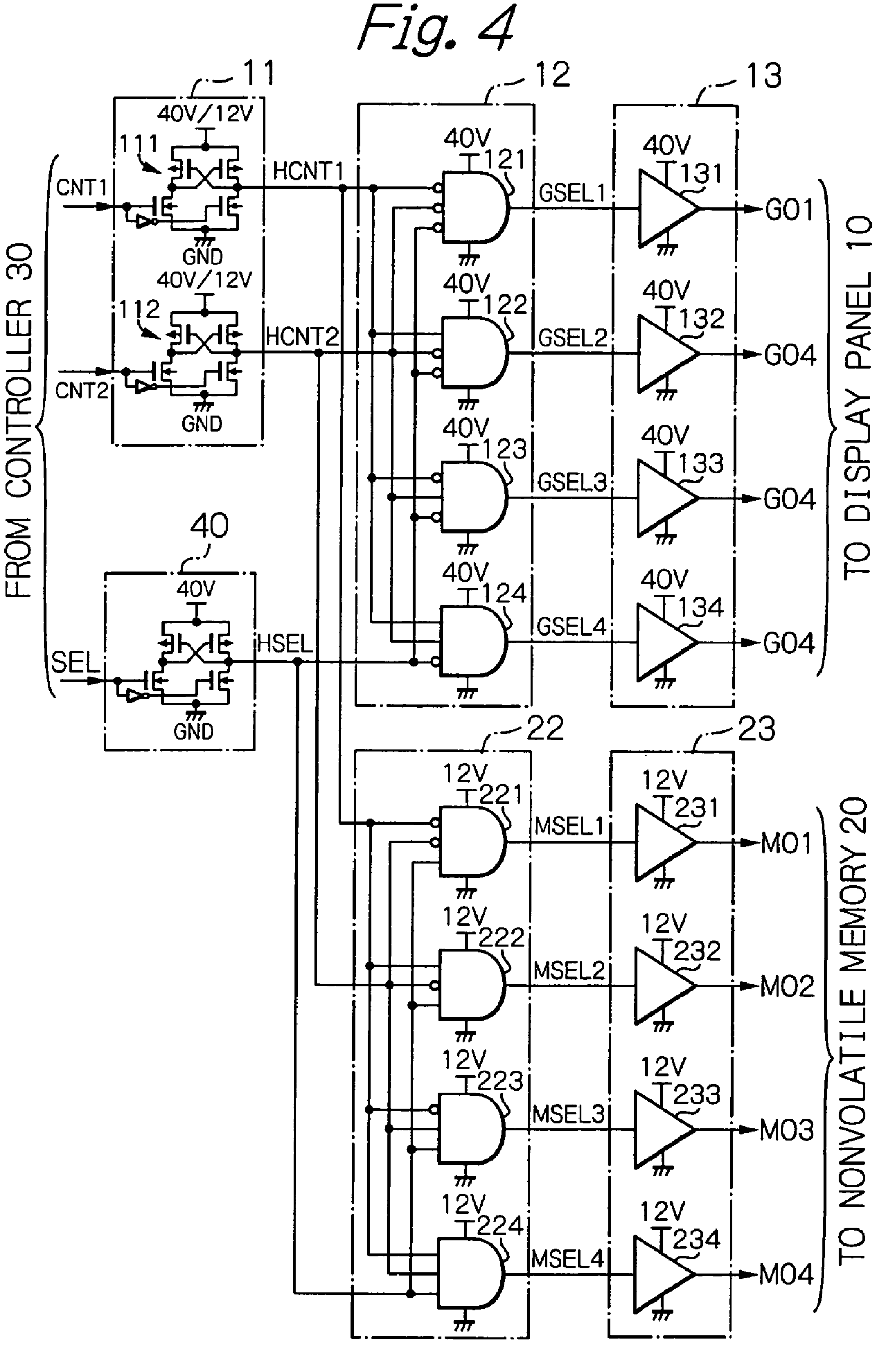
FIG. 4 is a circuit diagram of an example of the display apparatus of FIG. 3.

In FIG. 4, which illustrates a detailed circuit diagram of an example of the display apparatus of FIG. 3, $$n=m=2$$

$$\therefore N=M=2^2=4$$

In FIG. 4, the level shifter circuit 11 is constructed by a level shifter 111 powered by 40V or 12V for receiving a driver control signal CNT1 to generate a level-shifted driver control signal HCNT1 and a level shifter 112 powered by 40V or 12V for receiving a driver control signal CNT2 to generate a level-shifted driver control signal HCNT2. On the other hand, the level shifter circuit 40 is constructed by a single level shifter powered by 40V for receiving a selection signal SEL to generate a level-shifted selection signal HSEL.

The decoder circuit 12 is constructed by four gate circuits 121, 122, 123 and 124 powered by 40V for receiving the level-shifted driver control signal HCNT1 and HCNT2 from the level shifter circuit 11 and the level-shifted selection signal HSEL from the level shifter circuit 40 to generate gate selection signals GSEL1, GSEL2, GSEL3 and GSEL4, respectively. On the other hand, the decoder circuit 22 is constructed by four gate circuits 221, 222, 223 and 224 powered by 12V for receiving the level-shifted driver control signal HCNT1 and HCNT2 from the level shifter circuit 11 and the level-shifted selection signal HSEL from the level shifter circuit 40 to generate nonvolatile memory row selection signals MSEL1, MSEL2, MSEL3 and MSEL4, respectively. That is, when HSEL="0" (low level), all the gate circuits 121 to 124 are activated while all the gate circuits 221 to 224 are deactivated. On the other hand, when HSEL="1" (high level), all the gate circuits 121 to 124 are deactivated while all the gate circuits 221 to 224 are activated.

The driver circuit 13 is constructed by four drivers 131, 132, 133 and 134 powered by 40V for receiving the gate selection signals GSEL1, GSEL2, GSEL3 and GSEL4 to generate gate driving signals G01, G02, G03 and G04, respectively. On the other hand, the driver circuit 23 is constructed by four drivers 231, 232, 233 and 234 powered by 12V for receiving the nonvolatile memory row selection signals MSEL1, MSEL2, MSEL3 and MSEL4 to generate nonvolatile memory row driving signals M01, M02, M03 and M04, respectively.

In FIG. 4, the transistors of the level shifter circuits 11 and 40, the decoder circuit 12 and the driver circuit 13 have high breakdown voltage characteristics, while the transistors of the decoder circuit 22 and the driver circuit 23 have low breakdown voltage characteristics.

Figure 5:
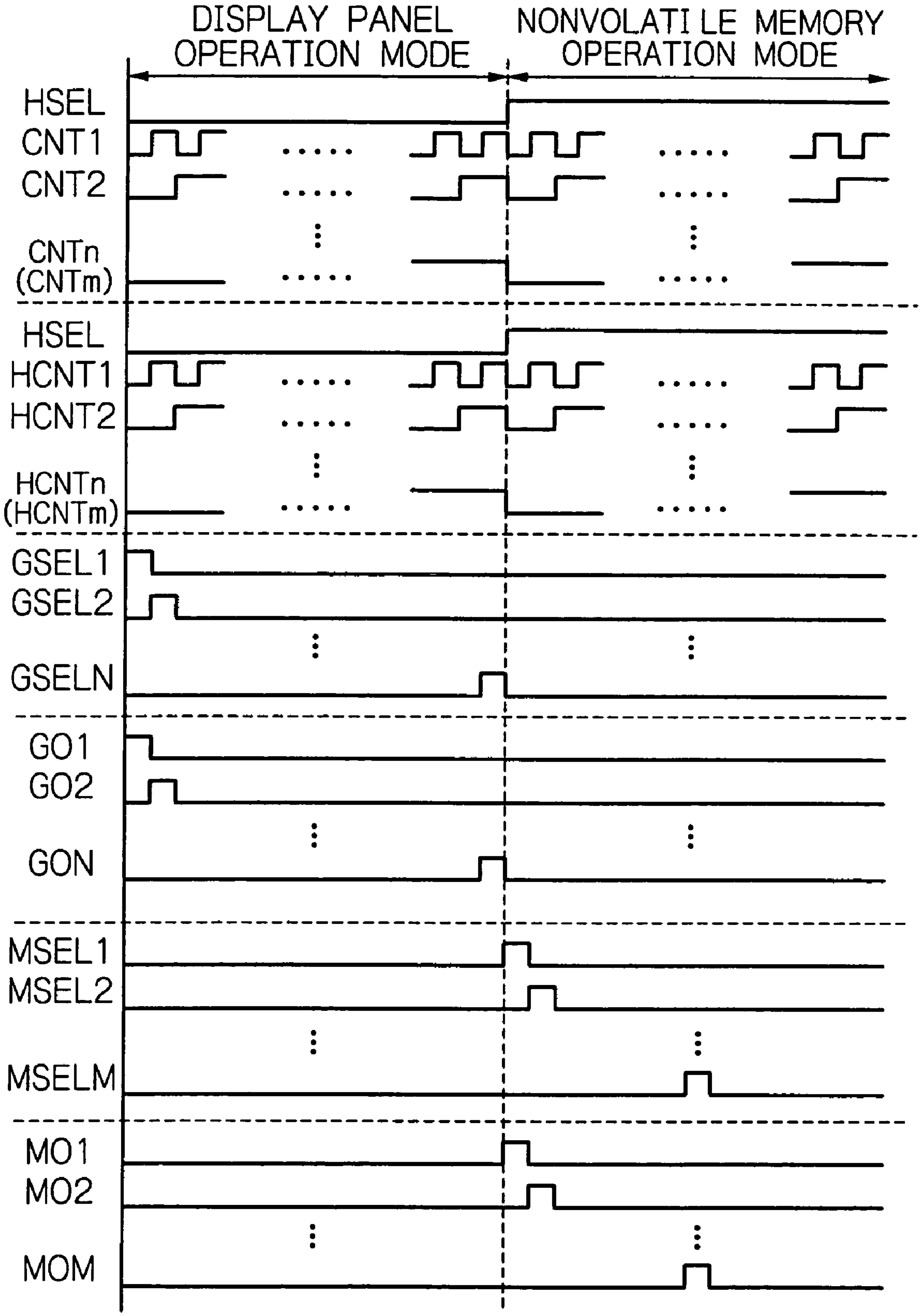
FIG. 5 is a timing diagram for explaining the operation of the display apparatus of FIG. 3.

The operation of the display apparatus of FIG. 3 will be explained next with reference to FIG. 5.

In a display panel operation mode, the controller 30 makes the selection signal SEL low. As a result, the level shifter circuit 40 makes the level-shifted selection signal HSEL low, so that the level shifter circuit 11 is powered by 40V and the decoder circuits 12 and 22 are activated and deactivated, respectively. Also, the controller 30 generates an n-bit control signal, i.e., an n-bit gate driver control signal formed by bits CNT1, CNT2, . . . , CNTn, so that the level shifter circuit 11 generates an n-bit level-shifted control signal, i.e., an n-bit shifted gate driver control signal formed by bits HCNT1, HCNT2, . . . , HCNTn. As a result, the decoder circuit 12 decodes the n-bit level-shifted gate driver control signal (HCNT1, HCNT2, . . . , HCNTn) to generate an N-bit gate selection signal formed by bits GSEL1, GSEL2, . . . , GSELN, so that the driver circuit 13 generates an N-bit gate driving signal formed by bits G01, G02, . . . , G0N. Thus, one gate line of the display panel 10 is driven.

In this display panel operation mode, since the decoder circuit 22 is deactivated, all of the bits MSEL1, MSEL2, . . . , MSELM of the M-bit nonvolatile memory row selection signal MSEL formed are low, and accordingly, all the bits MO1, MO2, . . . , MOM of the M-bit nonvolatile memory row driving signal MO are low.

In a nonvolatile memory operation mode such as a write/erase operation mode, the controller 30 makes the selection signal SEL high. As a result, the level shifter circuit 40 makes the level-shifted selection signal HSEL high, so that the level shifter circuit 11 is powered by 12V and the decoder circuits 12 and 22 are deactivated and activated, respectively. Also, the controller 30 generates an m-bit control signal, i.e., an m-bit ($m \leqq n$) nonvolatile memory row driver control signal formed by bits CNT1, CNT2, . . . , CNTm, so that the level shifter circuit 11 generates an m-bit level-shifted control signal, i.e., an m-bit level-shifted nonvolatile memory row driver control signal formed by bits HCNT1, HCNT2, . . . , HCNTm. As a result, the decoder circuit 22 decodes the m-bit level-shifted nonvolatile memory row driver control signal (HCNT1, HCNT2, . . . , HCNTm) to generate an M-bit nonvolatile memory row selection signal formed by bits MSEL1, MSEL2, . . . , MSELM, so that the driver circuit 23 generates an M-bit nonvolatile memory row driving signal formed by bits M01, MO2, . . . , MOM. Thus, one nonvolatile memory row of the nonvolatile memory 20 is driven.

In this nonvolatile memory operation mode, since the decoder circuit 12 is deactivated, all of the bits GSEL1, GSEL2, . . . , GSELN of the N-bit gate selection signal GSEL are low, and accordingly, all of the bits GO1, GO2, . . . , GON of the N-bit gate driving signal GO are low.

Figure 6:
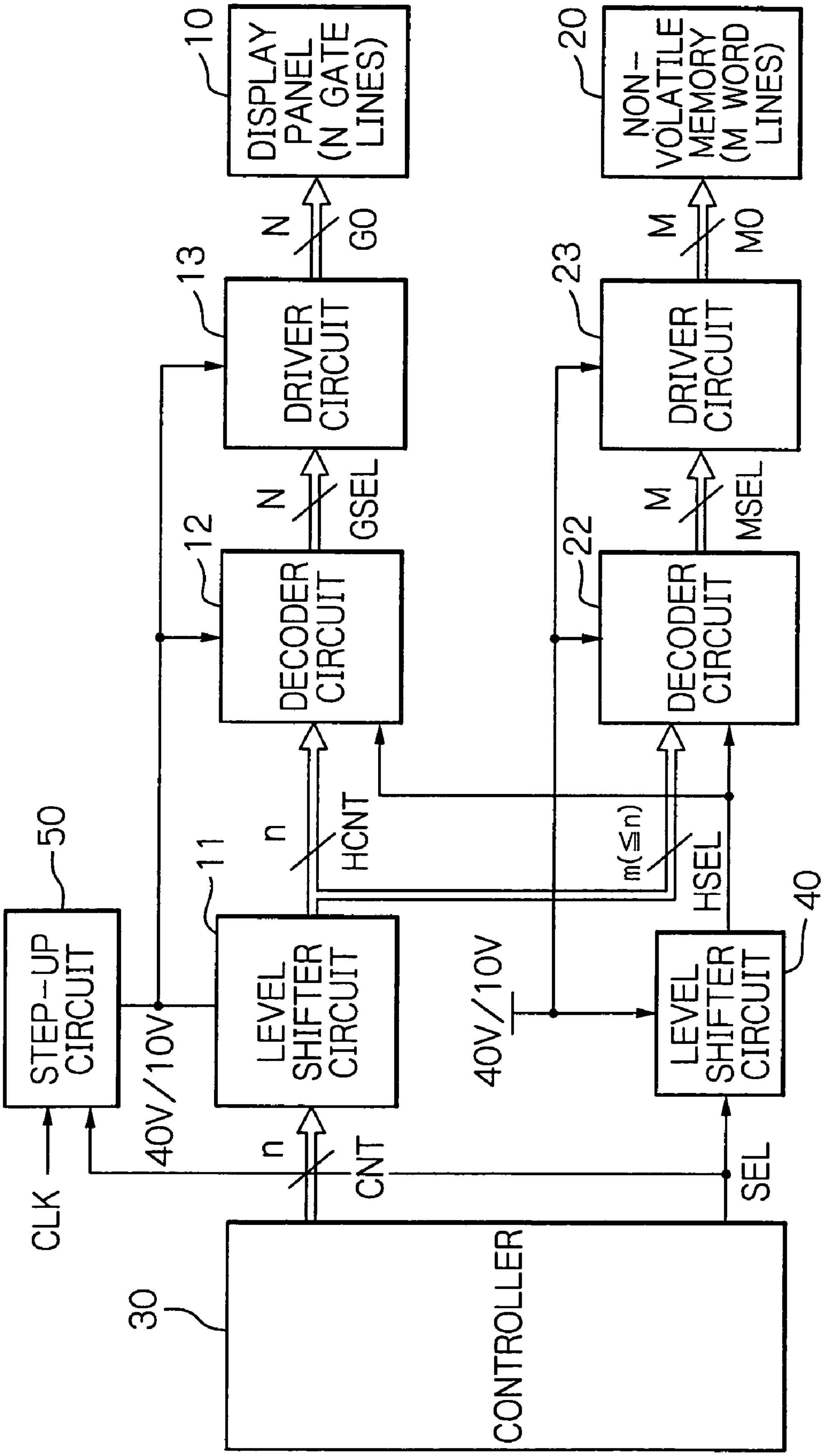
FIG. 6 is a block circuit diagram illustrating a second embodiment of the display apparatus according to the present invention.

In FIG. 6, which illustrates a second embodiment of the display apparatus according to the present invention, the step-up circuit controlled by a selection signal SEL from the controller 30 so as to decrease the display apparatus in size. Note that the step-up circuit 50 of FIG. 6 generates 10V instead of 12V in FIG. 3; however, there is no substantial difference therebetween.

Figure 7:
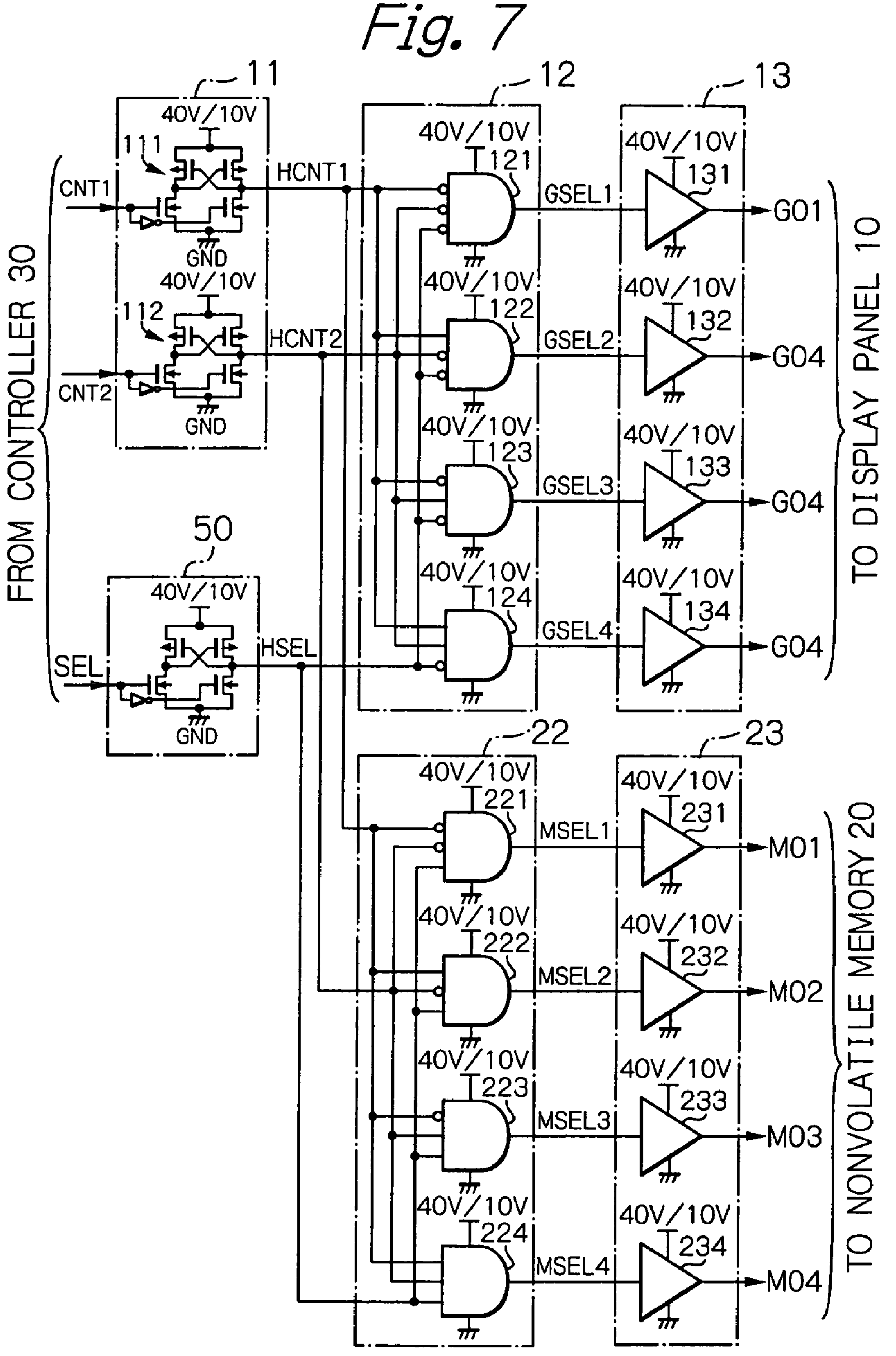
FIG. 7 is a circuit diagram of an example of the display apparatus of FIG. 6.

In FIG. 7, which illustrates a detailed circuit diagram of an example of the display apparatus of FIG. 6, $$n=m=2$$

$$\therefore N=M=2^2=4$$

In the level shifter circuit 11, the level shifters 111 and 112 are powered by 40V or 12V. Also, in the level shifter circuit 50, the single level shifter powered by 40V or 12V.

In the decoder circuit 12, the gate circuits 121, 122, 123 and 124 are powered by 40V or 12V. Also, in the decoder circuit 22, the gate circuits 221, 222, 223 and 224 powered by 40V or 12V.

In the driver circuit 13, drivers 131, 132, 133 and 134 are powered by 40V or 12V. Also, in the driver circuit 23, the drivers 231, 232, 233 and 234 are powered by 40V or 12V.

In FIG. 7, all the transistors of the level shifter circuits 11 and 40, the decoder circuits 12 and 22 and the driver circuits 13 and 23 have high breakdown voltage characteristics.

The operation of the display apparatus of FIG. 6 is similar to that of the display apparatus of FIG. 4.

Figure 8:
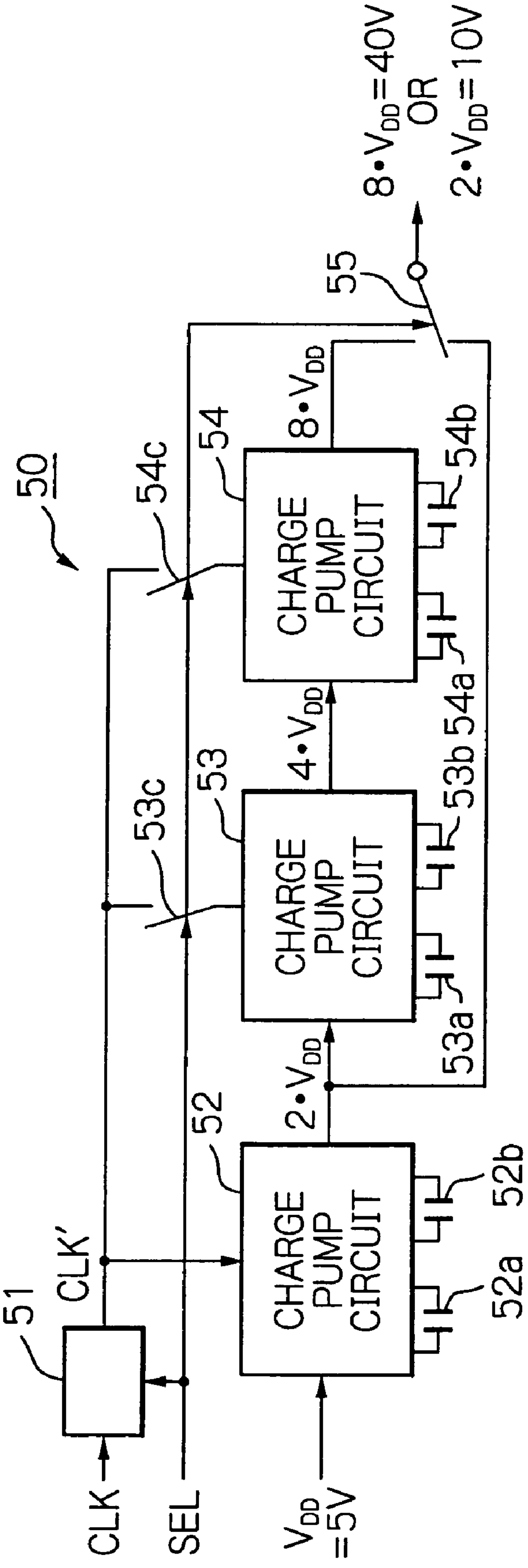
FIG. 8 is a detailed block circuit diagrams of the step-up circuit of FIG. 6.

In FIG. 8, which is a detailed circuit diagram of the step-up circuit 50 of FIG. 6, the step-up circuit 50 is constructed by a variable frequency divider 51, a charge pump circuit 52 for receiving a power supply voltage $V_{DD}$ to generate a voltage of $2 \cdot V_{DD}$, a charge pump circuit 53 for receiving the voltage $2 \cdot V_{DD}$ to generate a voltage of $4 \cdot V_{DD}$ ($=2 \times 2 \cdot V_{DD}$), a charge pump circuit 54 for receiving the voltage $4 \cdot V_{DD}$ to generate a voltage $8 \cdot V_{DD}$, and a switch 55 for selecting the voltage $2 \cdot V_{DD}$ or the voltage $V_{DD}$.

The variable frequency divider 51 is controlled by selection signal SEL. That is, when SEL="0" (low), the variable frequency divider 51 makes the frequency of a clock signal CLK' relatively low to decrease the current driving capability. On the other hand, when SEL="1" (high), the variable frequency divider 51 makes the frequency of the clock signal CLK' relatively high to increase the current driving capability.

The charge pump circuit 52 connected to a step-up capacitor 52*a* and a smoothing capacitor 52*b* is always clocked by the clock signal CLK'. On the other hand, the charge pump circuit 53 connected to a step-up capacitor 53*a* and a smoothing capacitor 53*b* and the charge pump circuit 54 connected to a step-up capacitor 54*a* and a smoothing capacitor 54*b* are clocked by the clock signal CLK' when the selection signal SEL is "0" (low level).

When SEL="0" (low), the switch 55 selects the voltage $8 \cdot V_{DD}$. On the other hand, when SEL="1" (high level), the switch 55 selects the voltage $2 \cdot V_{DD}$.

In the above-described embodiments, since $m \leqq n$, the level shifter circuit 11 receives an n-bit driver control signal CNT to generate an n-bit level-shifted driver control signal GCNT, and the decoder circuit 22 receives an m-bit level-shifted driver control signal, i.e., the entire or a part of the n-bit level-shifted driver control signal. However, if $m>n$, the level shifter circuit 11 receives an m-bit driver control signal CNT to generate an m-bit level-shifted driver control signal GCNT, and the decoder circuit 12 receives an n-bit level-shifted driver control signal, i.e., the entire or a part of the m-bit level-shifted driver control signal.

Also, in the above-described embodiments, the level shifter circuit 11 is common for the gate line driver of the LCD panel 10 and the rows of the nonvolatile memory 20; however, if possible in view of design, such a level shifter circuit can be common for the data line driver of the LCD panel and the rows and/or columns decoder of the nonvolatile memory 20.

The present invention can be applied to a passive type LCD apparatus, a plasma display apparatus, an organic EL apparatus or the like in addition to an active type LCD apparatus.

As explained hereinabove, according to the present invention, the display apparatus can be decreased in size.

The invention claimed is:

1. A driver unit for driving a display panel and a nonvolatile memory, comprising:

a level shifter circuit adapted to receive a driver control signal to generate a level-shifted driver control signal;

a display panel driver circuit connected between said level shifter circuit and said display panel and adapted to drive said display panel in accordance with said level-shifted driver control signal;

a nonvolatile memory driver circuit connected between said level shifter circuit and said nonvolatile memory to drive said nonvolatile memory in accordance with said level-shifted driver control signal; and a selection circuit connected to said display panel driver circuit and said nonvolatile memory driver circuit and adapted to select one of said display panel driver circuit and said nonvolatile memory driver circuit, wherein said selection circuit comprises an additional level shifter circuit adapted to receive a selection signal to generate a level-shifted selection signal and transmit it to said display panel driver circuit and said nonvolatile memory driver circuit so that one of said display panel driver circuit and said nonvolatile memory driver circuit is activated and the other is deactivated.

2. The driver unit as set forth in claim 1, wherein said display panel driver circuit receives all bits of said level-shifted driver control signal and said nonvolatile memory driver circuit receives at least a part of the bits of said level-shifted driver control signal.

3. The driver unit as set forth in claim 1, wherein said nonvolatile memory driver circuit receives all bits of said level-shifted driver control signal and said display panel driver circuit receives at least a part of the bits of said level-shifted driver control signal.

4. The driver unit as set forth in claim 1, wherein said display panel driver circuit comprises:

a first decoder connected to said level shifter circuit and adapted to decode an output signal of said level shifter circuit to generate a gate selection signal; and a first driver circuit connected to said first decoder and adapted to buffer said gate selection signal to drive one of gate lines of said display panel.

5. The driver unit as set forth in claim 1, wherein said nonvolatile memory driver circuit comprises:

a second decoder connected to said level shifter circuit and adapted to decode an output signal of said level shifter circuit to generate a nonvolatile memory row selection signal; and a second driver circuit connected to said second decoder and adapted to buffer said nonvolatile memory row selection signal to drive one of word lines of said display panel.

6. The driver unit as set forth in claim 1, further comprising:

a first step-up circuit adapted to generate a first voltage for powering said display panel driver circuit;

a second step-up circuit adapted to generate a second voltage for powering said nonvolatile memory driver circuit; and a switch circuit connected between said first and second step-up circuits and said level shifter circuit and adapted to power said level shifter circuit with one of said first and second voltages in accordance with whether said selection circuit selects said display panel driver circuit or said nonvolatile memory driver circuit.

7. The driver unit as set forth in claim 6, wherein said first voltage is higher than said second voltage.

8. The driver unit as set forth in claim 7, wherein said level shifter circuit, said selection circuit and said display panel driver circuit have higher breakdown voltage characteristics than those of said nonvolatile memory driver circuit.

9. The driver unit as set forth in claim 1, further comprising:

a common step-up circuit adapted to generate one of first and second voltages in accordance with whether said selection circuit selects said display panel driver circuit or said nonvolatile memory driver circuit, said level shifter circuit, said selection circuit, said display panel driver circuit and said nonvolatile memory driver circuit being powered with the one of first and second voltages.

10. The driver unit as set forth in claim 9, wherein said first voltage is higher than said second voltage.

11. The driver unit as set forth in claim 10, wherein said level shifter circuit, said selection circuit and said display panel driver circuit and said nonvolatile memory driver circuit have breakdown voltage characteristics which allow said level shifter circuit, said selection circuit, said display panel driver circuit, and said nonvolatile memory driver circuit to operate at said first voltage.

12. A display apparatus comprising:

a display panel;

a nonvolatile memory;

a level shifter circuit adapted to receive a first control signal to generate a level-shifted control signal;

a display panel driver circuit connected between said level shifter circuit and said display panel and adapted to drive said display panel in accordance with said level-shifted control signal;

a nonvolatile memory driver circuit connected between said level shifter circuit and said nonvolatile memory to drive said nonvolatile memory in accordance with said level-shifted control signal;

a selection circuit connected to said display panel driver circuit and said nonvolatile memory driver circuit and adapted to select one of said display panel driver circuit and said nonvolatile memory driver circuit, wherein said selection circuit comprises an additional level shifter circuit adapted to receive a selection signal to generate a level-shifted selection signal and transmit it to said display panel driver circuit and said nonvolatile memory driver circuit so that one of said display panel driver circuit and said nonvolatile memory driver circuit is activated and the other is deactivated.

13. A driver unit for driving a display panel and a nonvolatile memory, comprising:

a level shift circuit configured to receive a first input signal to generate a level-shifted driver control signal whose voltage level is one of first and second voltage levels different from each other;

a first decoder circuit configured to decode said level-shifted driver control signal to generate a first signal whose voltage level is said first voltage level;

a second decoder circuit configured to decode said level-shifted driver control signal to generate a second signal whose voltage level is said second voltage level;

a nonvolatile memory driver circuit powered by said first voltage level and configured to receive said first signal to drive said nonvolatile memory;

a display panel driver circuit powered by said second voltage level and configured to receive said second signal to drive said display panel; and an additional level shift circuit configured to receive a second input signal to generate a level-shifted selection signal, said level shift circuit receiving said level-shifted selection signal to select one of said first and second voltage levels used for a voltage level of said level-shifted driver control signal, one of said first and second decoder circuits is activated by said level-shifted selection signal, the other of said first and second decoder circuits is deactivated by said level-shifted selection signal.

14. The driver unit as set forth in claim 13, wherein one of said first and second decoder circuits inputs said level-shifted driver control signal and the other of said first and second decoder circuits does not input said level-shifted driver control signal, in response to said level-shifted selection signal.

15. The driver unit as set forth in claim 13, further comprising:

a first switch circuit for controlling a first reference voltage corresponding to said first voltage level supplied to said level shift circuit; and a second switch circuit for controlling a second reference voltage corresponding to said second voltage level supplied to said level shift circuit, one of said first and second switch circuits being turned on and the other of said first and second switch circuits being turned off, in response to said level-shifted selection signal.

16. The driver unit as set forth in claim 13, further comprising:

a controller for generating said first and second input signals, said second input signal being used for selecting one of:

a first operation mode for driving said nonvolatile memory; and a second operation mode for driving said display panel.

* * * * *